United States Patent
Sakakibara et al.

(10) Patent No.: US 12,112,869 B2
(45) Date of Patent: Oct. 8, 2024

(54) CHIP RESISTOR

(71) Applicant: ROHM CO., LTD., Kyoto (JP)

(72) Inventors: Soichi Sakakibara, Kyoto (JP);
Takanori Shinoura, Kyoto (JP);
Wataru Imahashi, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 168 days.

(21) Appl. No.: 17/773,720

(22) PCT Filed: Oct. 29, 2020

(86) PCT No.: PCT/JP2020/040557
§ 371 (c)(1),
(2) Date: May 2, 2022

(87) PCT Pub. No.: WO2021/095535
PCT Pub. Date: May 20, 2021

(65) Prior Publication Data
US 2022/0375657 A1    Nov. 24, 2022

(30) Foreign Application Priority Data

Nov. 12, 2019   (JP) .................................. 2019-204582

(51) Int. Cl.
*H01C 1/14* (2006.01)
*H01C 3/08* (2006.01)
*H05K 1/18* (2006.01)

(52) U.S. Cl.
CPC ................. *H01C 1/14* (2013.01); *H01C 3/08* (2013.01); *H05K 1/181* (2013.01); *H05K 2201/10022* (2013.01)

(58) Field of Classification Search
CPC ............. H01C 1/14; H01C 3/08; H05K 1/181
See application file for complete search history.

(56) References Cited

U.S. PATENT DOCUMENTS 7,098,768 B2 *   8/2006   Doi ...................... H01C 17/281
                                                       338/328
7,782,173 B2 *   8/2010   Urano ................. H01C 17/006
                                                       338/307
(Continued)

FOREIGN PATENT DOCUMENTS

CN          107359033 A      11/2017
CN          107507684 A      12/2017
(Continued)

OTHER PUBLICATIONS

JP-2003203801 translation (Year: 2003).*
(Continued)

*Primary Examiner* — Kyung S Lee
(74) *Attorney, Agent, or Firm* — HSML P.C.

(57) ABSTRACT

A chip resistor includes a substrate, an upper electrode and a resistor body, a back electrode, a side electrode, and a metal plating layer. The substrate includes an upper surface, a back surface that intersect a thickness-wise direction and a side surface that joins the upper surface and the back surface. The upper electrode and the resistor body are formed on the upper surface. The back electrode is formed on the back surface. The side electrode is formed on the side surface. The metal plating layer includes a back plating layer and a side plating layer. The back plating layer covers at least a portion of the back electrode. The side plating layer covers at least a portion of the side electrode. The metal plating layer has a thickness that is greater than or equal to 10 μm and less than or equal to 60 μm.

17 Claims, 13 Drawing Sheets

(56) References Cited

U.S. PATENT DOCUMENTS

| | | | |
|---|---|---|---|
| 10,192,659 B2 * | 1/2019 | Akahane | ................ H01C 1/028 |
| 2003/0172522 A1 | 9/2003 | Tanimura | |
| 2017/0271053 A1 | 9/2017 | Yoneda | |

FOREIGN PATENT DOCUMENTS

| | | | | |
|---|---|---|---|---|
| JP | S5947704 | | 3/1984 | |
| JP | 2003045702 | | 2/2003 | |
| JP | 2003203801 | * | 7/2003 | |
| JP | 2003209006 A | | 7/2003 | |
| JP | 3869273 | * | 1/2007 | ........... H01C 17/006 |
| JP | 4046178 | * | 2/2008 | |
| JP | 2008053251 | | 3/2008 | |
| JP | 2017168817 | | 9/2017 | |

OTHER PUBLICATIONS

JP-3869273 translation (Year: 2007).*
JP-4046178 translation (Year: 2008).*
International Search Report and Written Opinion issued for International Patent Application No. PCT/JP2020/040557, Date of mailing: Jan. 12, 2021, 9 pages including English translation of Search Report.
First Office Action issued for Chinese Patent Application No. 202080077758.9, dated Apr. 3, 2024, 13 pages including English machine translation.
Notice of Reasons for Refusal issued for Japanese Patent Application No. 2021-555999, Dispatch date: Jul. 23, 2024, 8 pages including English machine translation.

* cited by examiner

|  | Comparative Example 1 | Example 1-1 | Example 1-2 |
|---|---|---|---|
| Relief Layer Thickness [μm] | 25 | 25 | 25 |
| 1st Plating Layer Thickness [μm] | 0 | 10 | 30 |
| Von Mises Stress at 1st Measure Point [MPa] | 270.9 | 254.2 | 237.8 |
| Von Mises Stress at 2nd Measure Point [MPa] | 292.4 | 231.2 | 195.1 |

|  | Comparative Example 2 | Example 2-1 | Example 2-2 |
|---|---|---|---|
| Relief Layer Thickness [μm] | 0 | 0 | 0 |
| 1st Plating Layer Thickness [μm] | 0 | 10 | 30 |
| Von Mises Stress at 1st Measure Point [MPa] | 299.3 | 263.3 | 261.9 |
| Von Mises Stress at 2nd Measure Point [MPa] | 343.1 | 238.6 | 200.9 |

|  | Comparative Example 3 | Example 3 |
|---|---|---|
| Relief Layer Thickness [μm] | 25 | 25 |
| 1st Plating Layer Thickness [μm] | 30 | 30 |
| Substrate Thickness [mm] | 0.47 | 0.28 |
| Von Mises Stress at 1st Measure Point [MPa] | 237.8 | 216.5 |
| Von Mises Stress at 2nd Measure Point [MPa] | 195.1 | 177.7 |

CHIP RESISTOR

TECHNICAL FIELD

The present disclosure relates to a chip resistor.

BACKGROUND ART

A conventional chip resistor that is configured to be surface-mounted on a wiring substrate of various electronic apparatuses is widely known. Patent Literature 1 discloses an example of a chip resistor that includes an insulation substrate, two electrodes disposed on opposite ends of the insulation substrate, a resistor body electrically connected to the electrodes, and two plating layers respectively formed on a surface of the two electrodes.

CITATION LIST

Patent Literature

Patent Literature 1: Japanese Laid-Open Patent Publication No. 2008-53251

SUMMARY OF INVENTION

Technical Problem

The chip resistor described above is mounted on the wiring substrate with solder. In general, the substrate of the chip resistor and the wiring substrate differ from each other in linear expansion coefficient. This causes the substrate of the chip resistor and the wiring substrate to expand and contract in different manners when the ambient temperature of the electronic apparatus changes. During the use of the chip resistor, if the ambient temperature repetitively changes, repetitive stress acts on solder that bonds the chip resistor and the wiring substrate. As a result, cracks may be formed in the solder.

It is an object of the present disclosure to provide a chip resistor that limits formation of cracks in the solder.

Solution to Problem

To solve the above problem, a chip resistor includes a substrate including an upper surface, a back surface, and a side surface so that the upper surface and the back surface intersect a thickness-wise direction and the side surface joins the upper surface and the back surface, an upper electrode and a resistor body formed on the upper surface, a back electrode formed on the back surface, a side electrode formed on the side surface, and a metal plating layer including a back plating layer covering at least a portion of the back electrode and a side plating layer covering at least a portion of the side electrode. The metal plating layer has a thickness that is greater than or equal to 10 μm and less than or equal to 60 μm.

The chip resistor configured as described above includes the metal plating layer having a large thickness. Thus, when the chip resistor is mounted on a wiring substrate and the ambient temperature increases, the difference in expansion amount between the chip resistor and the wiring substrate is likely to be decreased. When the ambient temperature decreases, the difference in contraction amount between the chip resistor and the wiring substrate, on which the chip resistor is mounted, is likely to be decreased. Thus, when the ambient temperature changes, less stress is generated in solder. Accordingly, the chip resistor limits formation of cracks in solder that bonds the chip resistor and the wiring substrate.

Advantageous Effects of Invention

The chip resistor described above limits formation of cracks in solder.

DESCRIPTION OF EMBODIMENTS

Figure 1:
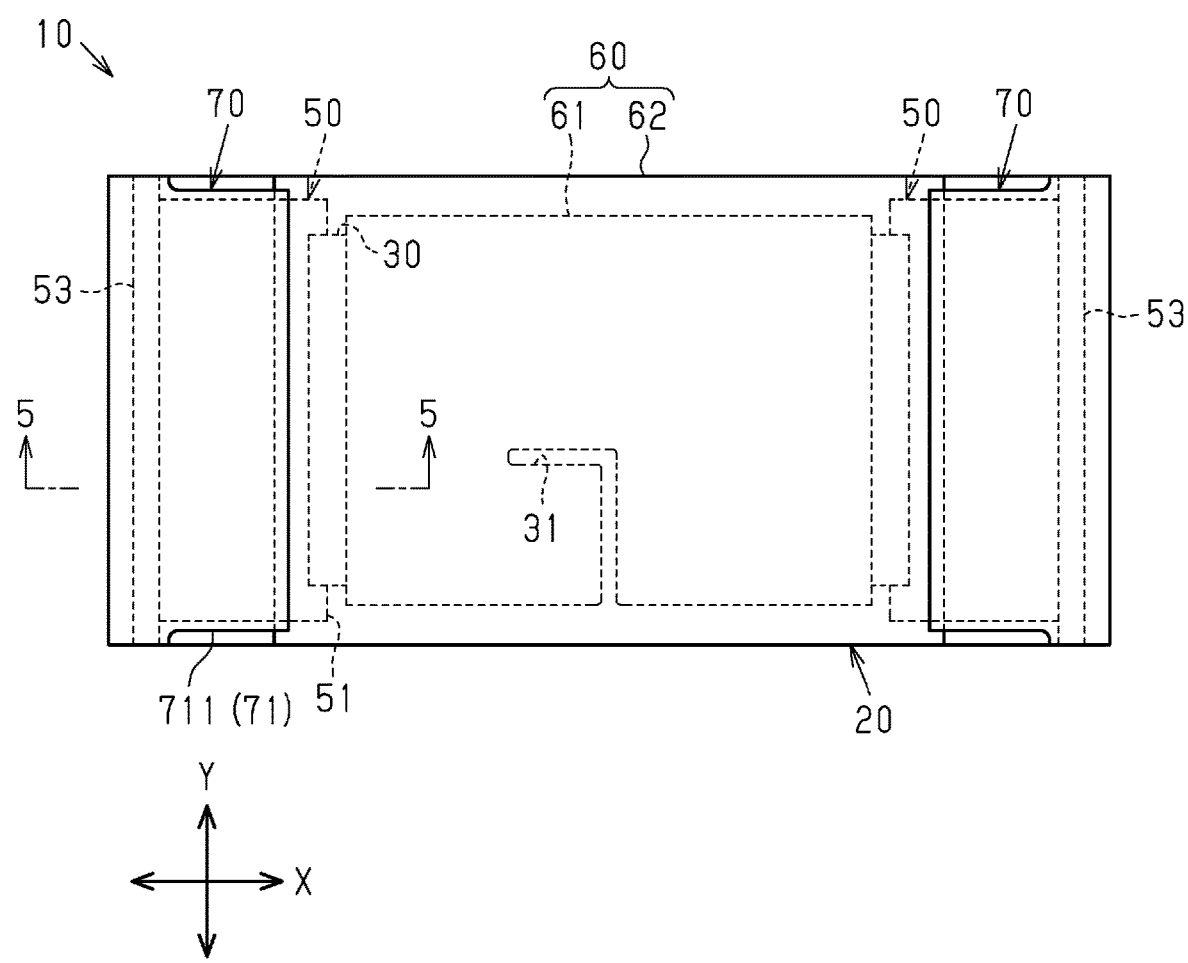
FIG. 1 is a plan view showing a first embodiment of a chip resistor.

Embodiments of a chip resistor will be described below with reference to the drawings. The embodiments described below exemplify configurations and methods for embodying a technical concept and are not intended to limit the material, shape, structure, layout, dimensions, and the like of each component to those described below. The embodiments described below may undergo various modifications.

First Embodiment

A first embodiment of a chip resistor 10 will now be described with reference to FIGS. 1 to 8.

As shown in FIGS. 1 to 5, the chip resistor 10 includes a substrate 20, a resistor body 30, two relief layers 40, two electrodes 50, a protective layer 60, and two plating layers 70. To facilitate understanding, FIGS. 2 and 4 do not show part of the protective layer 60 and do not show the plating layers 70.

In the description of the chip resistor 10, for the sake of brevity, the thickness-wise direction of the substrate 20 is referred to as "the thickness-wise direction Z". A direction orthogonal to the thickness-wise direction Z is referred to as "the first direction X". A direction orthogonal to the thickness-wise direction Z and the first direction X is referred to as "the second direction Y".

The chip resistor 10 is configured to be surface-mounted on a wiring substrate of various electronic apparatus (hereafter, it may be referred to as "wiring substrate 80"). The chip resistor 10 functions to limit current flowing to the wiring substrate 80. The chip resistor 10 is a thick-film-type resistor, that is, a metal glaze resistor.

As shown in FIG. 1, as viewed in the thickness-wise direction Z, the chip resistor 10 is rectangular so that the long sides extend in the first direction X and the short sides extend in the second direction Y. Alternatively, the chip resistor 10 may be rectangular so that the short sides extend in the first direction X and the long sides extend in the second direction Y or may have sides that are equal in length in the first direction X and the second direction Y.

The substrate 20 will now be described.

As shown in FIGS. 1 to 5, the resistor body 30, the two relief layers 40, the two electrodes 50, the protective layer 60, and the two plating layers 70 are disposed on the substrate 20. The substrate 20 is insulative. As viewed in the thickness-wise direction Z, the substrate 20 is rectangular so that the long sides extend in the first direction X and the short sides extend in the second direction Y. In an example, the dimension of the substrate 20 in the first direction X is 3.2 mm, the dimension of the substrate 20 in the second direction Y is 1.6 mm. The thickness of the substrate 20 is 0.47 mm and is referred to as a substrate thickness Th1.

When the chip resistor 10 is used, heat is generated from the resistor body 30. Hence, the substrate 20 is required to have excellent heat dissipation properties. It is preferred that the material of the substrate 20 has a relatively high thermal conductivity. The substrate 20 is formed from, for example, ceramic including alumina ($Al_2O_3$).

Figure 5:
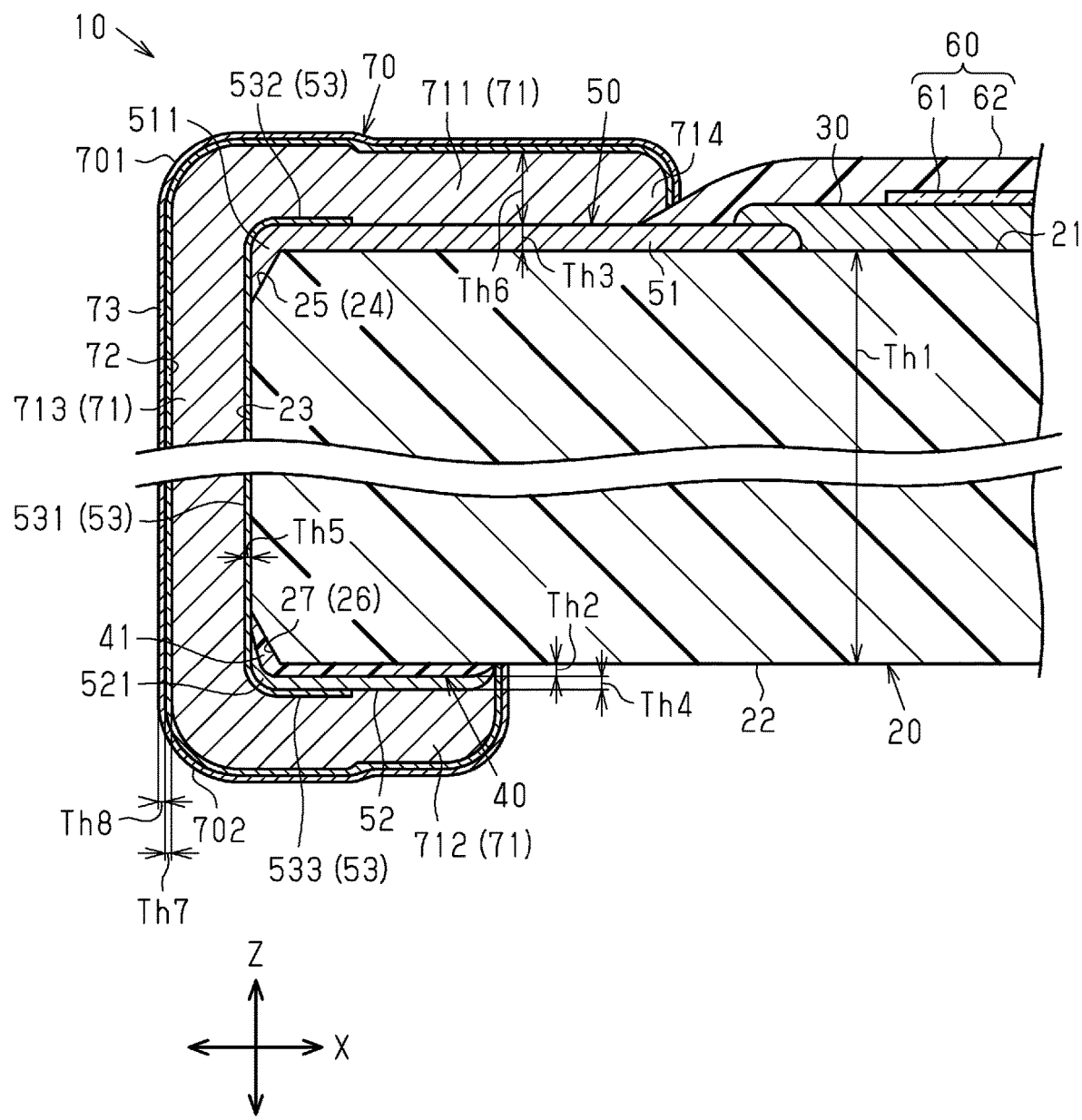
FIG. 5 is a cross-sectional view taken along line 5-5 in FIG. 1.

As shown in FIG. 5, the substrate 20 includes an upper surface 21, a back surface 22, and side surfaces 23. The upper surface 21 and the back surface 22 intersect the thickness-wise direction Z and are, for example, orthogonal to the thickness-wise direction Z.

Figure 2:
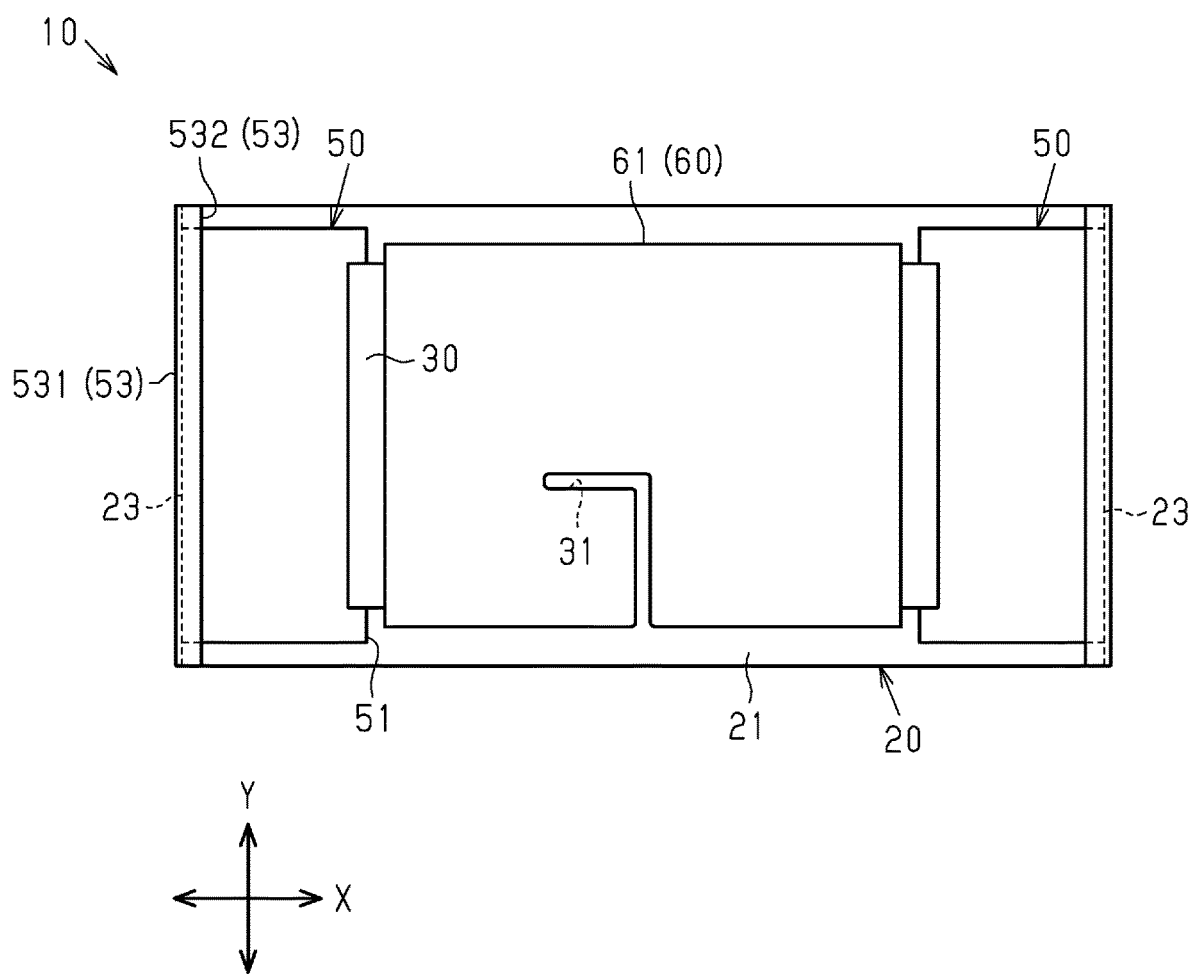
FIG. 2 is a plan view showing the chip resistor of the first embodiment with a second protective layer and a plating layer removed.
Figure 4:
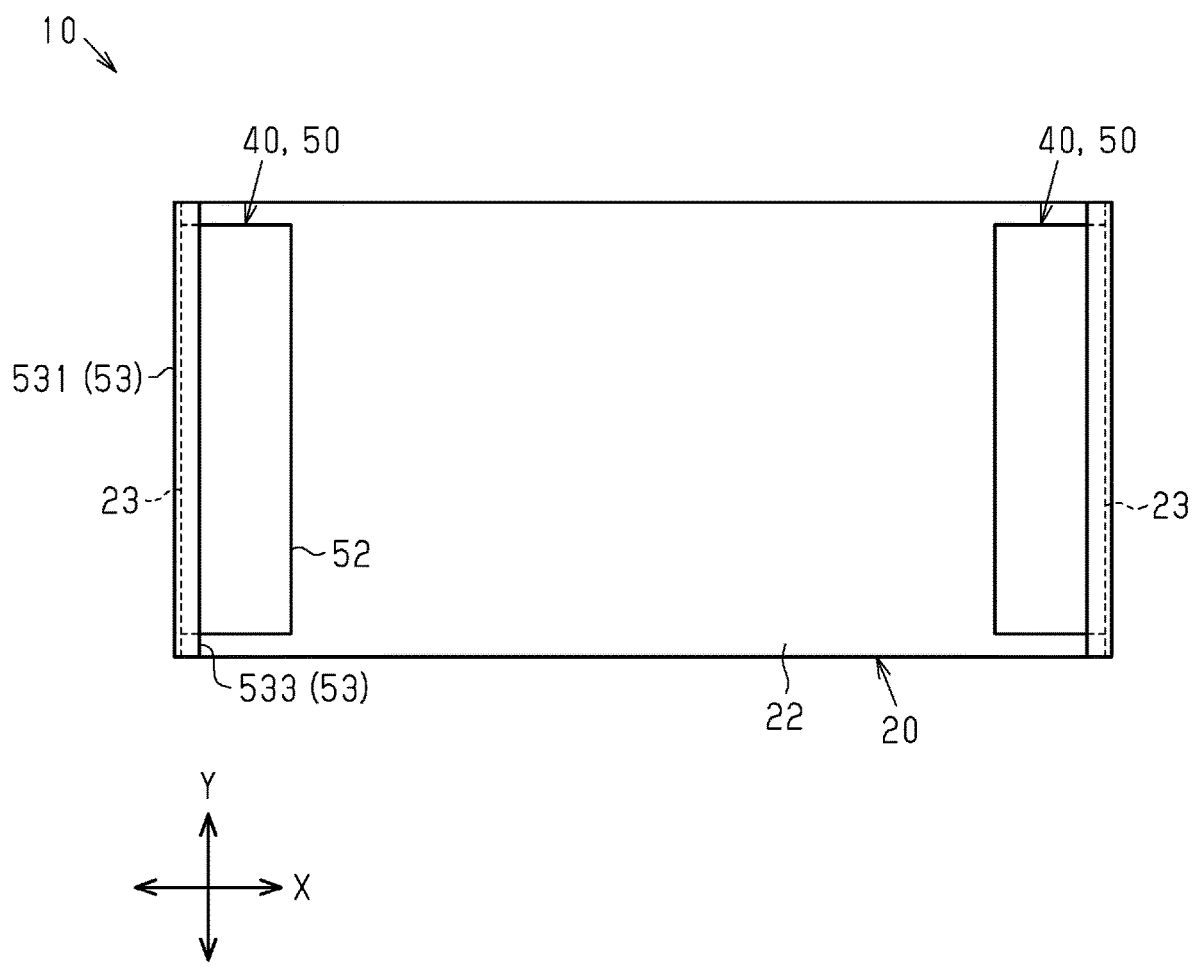
FIG. 4 is a bottom view showing the chip resistor of the first embodiment with the plating layer removed.

As shown in FIGS. 2 and 4, the upper surface 21 and the back surface 22 are rectangular so that the long sides extend in the first direction X and the short sides extend in the second direction Y. The upper surface 21 and the back surface 22 face in opposite directions in the thickness-wise direction Z. The upper surface 21 faces upward in FIG. 5. The back surface 22 faces downward in FIG. 5. When the chip resistor 10 is mounted on the wiring substrate 80, the back surface 22 faces the wiring substrate 80.

Each side surface 23 is rectangular so that the long sides extend in the second direction Y and the short sides extend in the thickness-wise direction Z. The side surface 23 intersects the first direction X and is, for example, orthogonal to the first direction X. The side surface 23 is joined to the upper surface 21 and the back surface 22. As shown in FIGS. 2 and 4, two of the side surfaces 23 are spaced apart in the first direction X. The two side surfaces 23 are spaced apart from each other in the first direction X.

The substrate 20 includes chamfered corners. More specifically, as shown in FIG. 5, the substrate 20 includes a first corner 24 joined to the upper surface 21 and the side surface 23 and including a first inclined surface 25. The substrate 20 includes a second corner 26 joined to the back surface 22 and the side surface 23 and including a second inclined surface 27. The first inclined surface 25 intersects the upper surface 21 and the side surface 23. The second inclined surface 27 intersects the back surface 22 and the side surface 23. In this regard, in the first embodiment, the second corner corresponds to an example of a "corner". The second inclined surface corresponds to an example of an "inclined surface". The first inclined surface 25 and the second inclined surface 27 are formed in a manufacturing process of the chip resistor 10, for example, when the substrate 20 is cut and separated from a large substrate formed of alumina.

The resistor body 30 will now be described.

As shown in FIGS. 1, 2, and 5, the resistor body 30 is formed on the upper surface 21 of the substrate 20. In the first embodiment, the resistor body 30 is in contact with the upper surface 21 of the substrate 20. As viewed in the thickness-wise direction Z, the resistor body 30 is belt-shaped and extends in the first direction X and the second direction Y. The resistor body 30 is formed of metal particles and glass. The metal particles are, for example, ruthenium dioxide ($RuO_2$) or a silver (Ag)-palladium (Pd) alloy.

An intermediate element may be disposed between the resistor body 30 and the upper surface 21 of the substrate 20. Even in this case, it is considered that the resistor body 30 is formed on the upper surface 21 of the substrate 20. More specifically, the resistor body 30 that is formed on the upper surface 21 of the substrate 20 includes a mode in which the resistor body 30 is directly formed on the upper surface 21 of the substrate 20 and a mode in which the resistor body 30 is formed on the upper surface 21 of the substrate 20 with the intermediate element disposed therebetween. The same applies to the following description.

As shown in FIG. 2, a trimming groove 31 extends through the resistor body 30 in the thickness-wise direction Z. The trimming groove 31 is integrally formed in the resistor body 30 and a first protective layer 61, which will be described later. In the first embodiment, as viewed in the thickness-wise direction Z, the trimming groove 31 is substantially L-shaped. The trimming groove 31 is formed in the manufacturing process of the chip resistor 10 so that the resistance value of the resistor body 30 is adjusted to a desired resistance value. In this regard, the trimming groove 31 does not necessarily have to be L-shaped.

The relief layers 40 will now be described.

As shown in FIG. 4, the two relief layers 40 are disposed on the substrate 20 and spaced apart from each other in the first direction X. That is, the chip resistor 10 includes the two relief layers 40 spaced apart from each other in the first direction X. The two relief layers 40 are identical in shape. The structure of one of the relief layers 40 will be described in detail below.

As shown in FIG. 5, each relief layer 40 is formed on the back surface 22 of the substrate 20 near the side surface 23. The relief layer 40 is directly formed on the back surface 22 of the substrate 20 and is in contact with the back surface 22 of the substrate 20. The relief layer 40 is formed from an insulative synthetic resin. The relief layer 40 is formed from, for example, an epoxy resin. It is preferred that the thickness of the relief layer 40, which is referred to as a relief layer thickness Th2, is, for example, greater than or equal to 5 μm and less than or equal to 25 μm. In the first embodiment, the relief layer thickness Th2 is 7 μm.

The relief layer 40 is also formed on the second inclined surface 27. Since the second inclined surface 27 is inclined, the portion of the relief layer 40 formed on the second inclined surface 27 is curved. Thus, one of the opposite ends of the relief layer 40 in the first direction X corresponding to the side surface 23 of the substrate 20 is round, defining a relief layer end 41. That is, the relief layer end 41 is roundly curved. This mitigates a concentration of stress on the relief layer end 41 as compared to when the relief layer end 41 is bent at a right angle.

The electrodes 50 will now be described.

As shown in FIGS. 1 to 5, the two electrodes 50 are disposed on the substrate 20 and spaced apart from each other in the first direction X. That is, the chip resistor 10 includes the two electrodes 50 spaced apart from each other in the first direction X. The two electrodes 50 are joined to the resistor body 30 at opposite ends of the resistor body 30 in the first direction X. That is, the first direction X may be referred to as a direction in which the two electrodes 50 face each other with the substrate 20 located therebetween. The two electrodes 50 are identical in shape. The structure of one of the electrodes 50 will be described in detail below.

As shown in FIG. 5, each electrode 50 includes an upper electrode 51, a back electrode 52, and a side electrode 53.

As shown in FIGS. 2 and 5, the upper electrode 51 is belt-shaped and extends in the first direction X and the second direction Y. The upper electrode 51 is formed on the upper surface 21 of the substrate 20. In the first embodiment, the upper electrode 51 is in contact with the upper surface 21 of the substrate 20. The upper electrode 51 is joined to an end of the resistor body 30 in the first direction X. As viewed in the thickness-wise direction Z, the upper electrode 51 and the resistor body 30 partially overlap. More specifically, the end of the resistor body 30 in the first direction X is disposed on an end of the upper electrode 51 in the first direction X. Thus, the upper electrode 51 is electrically connected to the resistor body 30. The upper electrode 51 is also formed on the first inclined surface 25. Since the first inclined surface 25 is inclined, the portion of the upper electrode 51 formed on the first inclined surface 25 has a curved outer shape. Thus, one of opposite ends of the upper electrode 51 in the first direction X located closer to the side surface 23 of the substrate 20 is round, defining an upper electrode end 511. That is, the upper electrode end 511 is roundly curved. This mitigates concentration of stress on the upper electrode end 511 as compared to when the upper electrode end 511 is bent at a right angle.

An intermediate element may be formed between the upper electrode 51 and the upper surface 21 of the substrate 20. More specifically, the formation mode of the upper electrode 51 includes a mode in which the upper electrode 51 is directly formed on the upper surface 21 of the substrate 20 and a mode in which the upper electrode 51 is formed on the upper surface 21 of the substrate 20 with the intermediate element disposed therebetween.

The upper electrode 51 is formed from a material including silver particles and glass. The thickness of the upper electrode 51 is, for example, 14 μm and is referred to as an upper electrode thickness Th3.

As shown in FIGS. 4 and 5, the back electrode 52 is belt-shaped and extends in the first direction X and the second direction Y. The back electrode 52 is formed on the back surface 22 of the substrate 20. More specifically, as shown in FIG. 5, the back electrode 52 is formed on the back surface 22 of the substrate 20 with the relief layer 40 disposed therebetween. Even when the relief layer 40 is disposed between the back surface 22 of the substrate 20 and the back electrode 52, it is considered that the back electrode 52 is formed on the back surface 22 of the substrate 20. The back electrode 52 may be referred to as an electrode positioned to face the back surface 22 of the substrate 20 in the thickness-wise direction Z.

As described above, in conformance with the round relief layer end 41 of the relief layer 40, one of opposite ends of the back electrode 52 in the first direction X located closer to the side surface 23 of the substrate 20 is round, defining a back electrode end 521. That is, the back electrode end 521 is roundly curved. This mitigates concentration of stress on the back electrode end 521 as compared to when the back electrode end 521 is bent at a right angle.

The relief layer 40 is formed on an end of the back surface 22 of the substrate 20 in the first direction X. That is, the relief layer 40 and the upper electrode 51 face each other with the substrate 20 located therebetween. The back electrode 52 is formed on the relief layer 40 to cover at least a portion of the relief layer 40. In the first embodiment, the back electrode 52 covers the entirety of the relief layer 40. The dimension of the relief layer 40 and the back electrode 52 in the first direction X is set to be less than the dimension of the upper electrode 51 in the first direction X. That is, the upper electrode 51 extends closer to the center of the substrate 20 in the first direction X than the back electrode 52.

The back electrode 52 is formed from, for example, a synthetic resin including metal particles. The metal particles are, for example, silver. The synthetic resin is, for example, an epoxy resin. Thus, the back electrode 52 is electrically conductive. However, the back electrode 52 is not limited to a synthetic resin including metal particles and may be, for example, glass including metal particles. The thickness of the back electrode 52, which is referred to as a back electrode thickness Th4, is less than the upper electrode thickness Th3. The back electrode thickness Th4 is, for example, 7 μm.

As shown in FIGS. 2, 4, and 5, the side electrode 53 is configured to electrically connect the upper electrode 51 and the back electrode 52. The side electrode 53 includes a main body 531, an upper connector 532, and a back connector 533.

The main body 531 is belt-shaped and extends in the second direction Y and the thickness-wise direction Z. The main body 531 is formed on the side surface 23 of the substrate 20. In the first embodiment, the main body 531 is in contact with the side surface 23 of the substrate 20. The main body 531 extends beyond opposite ends of the side surface 23 of the substrate 20 in the thickness-wise direction Z and is in contact with a side surface of the upper electrode 51, a side surface of the relief layer 40, and a side surface of the back electrode 52.

The upper connector 532 is belt-shaped and extends in the first direction X and the second direction Y. As viewed in the thickness-wise direction Z, the upper connector 532 is positioned to overlap the upper electrode 51. The upper connector 532 is in contact with the upper electrode 51. Thus, the upper connector 532 is electrically connected to the upper electrode 51. The upper connector 532 covers a portion of the upper electrode 51 including the upper electrode end 511. Thus, the upper electrode 51 includes a portion that is covered by the upper connector 532 and a portion that is not covered by the upper connector 532.

The upper connector 532 is joined to the main body 531. Thus, the upper connector 532 is electrically connected to the main body 531. In conformance with the round curve of the upper electrode end 511, the joint of the upper connector 532 and the main body 531 is roundly curved.

The back connector 533 is belt-shaped and extends in the first direction X and the second direction Y. As viewed in the thickness-wise direction Z, the back connector 533 is positioned to overlap the back electrode 52. The back connector 533 is in contact with the back electrode 52. Thus, the back connector 533 is electrically connected to the back electrode 52. The back connector 533 covers a portion of the back electrode 52 including the back electrode end 521. Thus, the back electrode 52 includes a portion that is covered by the back connector 533 and a portion that is not covered by the back connector 533.

The back connector 533 is joined to the main body 531. Thus, the back connector 533 is electrically connected to the main body 531. In conformance with the round curve of the back electrode end 521, the joint of the back connector 533 and the main body 531 is roundly curved.

As described above, the side electrode 53 is joined to both the upper electrode 51 and the back electrode 52. Thus, the back electrode 52 is electrically connected to the resistor body 30 by the side electrode 53 and the upper electrode 51.

An intermediate element may be formed between the side electrode 53 and the side surface 23 of the substrate 20. More specifically, the formation of the main body 531 of the side electrode 53 includes a mode in which the main body 531 is directly formed on the side surface 23 of the substrate 20 and a mode in which the main body 531 is formed on the side surface 23 of the substrate 20 with the intermediate element disposed therebetween.

The side electrode 53 is formed of, for example, a thin metal film. The thin metal film is formed from, for example, an alloy including nickel (Ni) and chromium (Cr). Preferably, the thickness of the side electrode 53, which is referred to as a side electrode thickness Th5, is less than each of the upper electrode thickness Th3 and the back electrode thickness Th4. The main body 531, the upper connector 532, and the back connector 533 may have the same thickness or different thicknesses.

The protective layer 60 will now be described.

As shown in FIGS. 1, 2, and 5, the protective layer 60 includes the first protective layer 61 and a second protective layer 62.

As shown in FIGS. 1 and 5, the first protective layer 61 covers a central portion of the resistor body 30 in the first direction X. In the first direction X, the first protective layer 61 is shorter than the resistor body 30. Thus, the resistor body 30 extends in the first direction X from opposite ends of the first protective layer 61 in the first direction X. The trimming groove 31, which has been described, is formed in the first protective layer 61. The first protective layer 61 is formed from, for example, a material including glass.

As shown in FIGS. 1 and 5, the second protective layer 62 covers the first protective layer 61 and the portion of the resistor body 30 that is not covered by the first protective layer 61. In addition, the second protective layer 62 extends beyond the resistor body 30 in the first direction X and covers a portion of the upper electrode 51. The second protective layer 62 is formed from, for example, a material including a black epoxy resin.

As shown in FIGS. 2 and 5, the upper connector 532 of the side electrode 53 is spaced apart from the second protective layer 62 in the first direction X. Thus, the portion of the upper electrode 51 located between the upper connector 532 and the second protective layer 62 is not covered by any of the upper connector 532 and the second protective layer 62.

The plating layers 70 will now be described.

Figure 3:
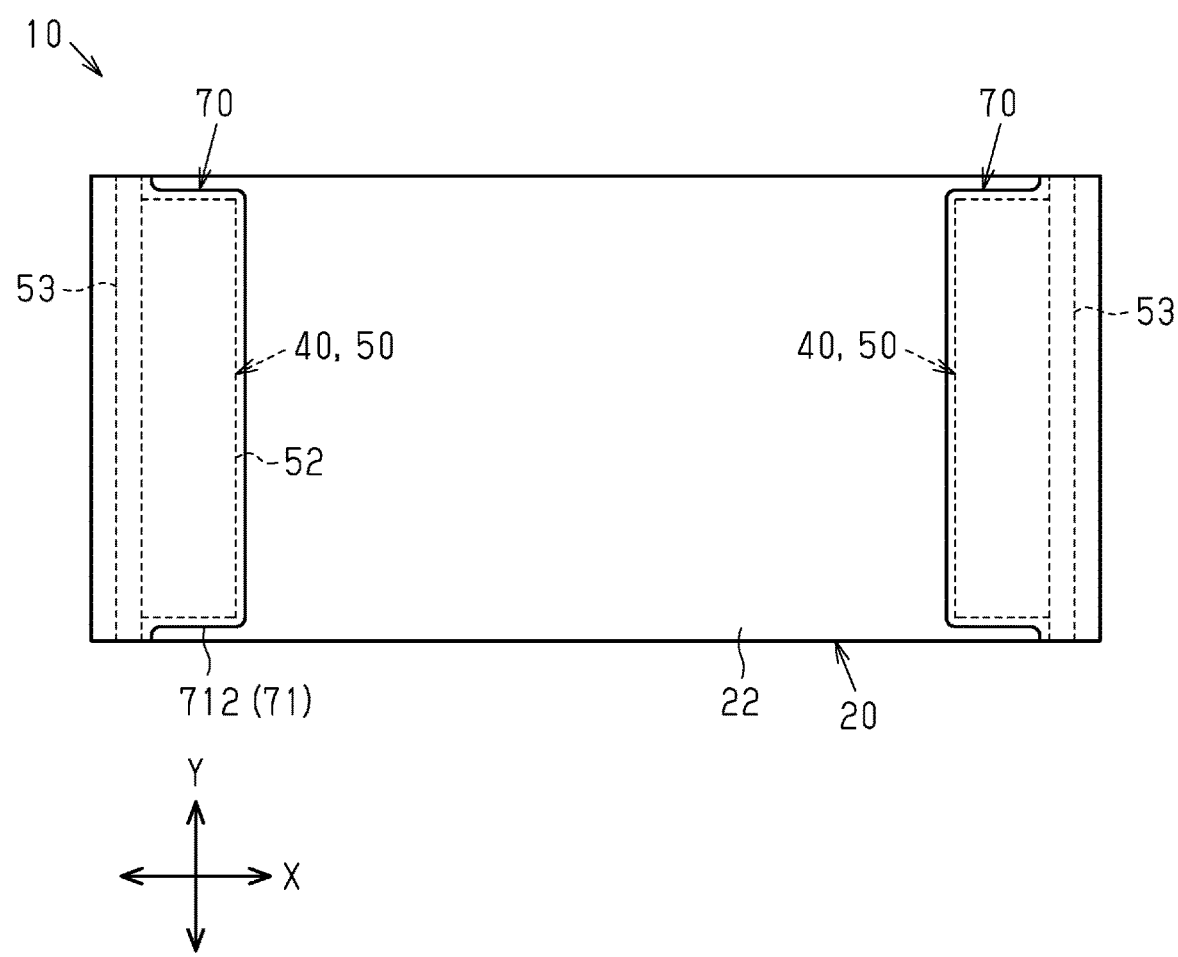
FIG. 3 is a bottom view showing the chip resistor of the first embodiment.

As shown in FIGS. 1 and 3, the two plating layers 70 are disposed on the substrate 20 and spaced apart from each other in the first direction X. That is, the chip resistor 10 includes the two plating layers 70 spaced apart from each other in the first direction X. The two plating layers 70 are identical in shape. The structure of one of the plating layers 70 will be described in detail.

As shown in FIG. 5, the plating layers 70 include a first plating layer 71, which is an example of a "metal plating layer", a second plating layer 72, and a third plating layer 73.

The first plating layer 71 is formed over the upper electrode 51, the side electrode 53, and the back electrode 52 to cover at least a portion of the upper electrode 51, at least a portion of the side electrode 53, and at least a portion of the back electrode 52. The first plating layer 71 is substantially C-shaped as viewed in the second direction Y. The first plating layer 71 is formed from, for example, copper (Cu). The first plating layer 71 includes an upper plating layer 711, a back plating layer 712, and a side plating layer 713.

The upper plating layer 711 is positioned to face the upper surface 21 of the substrate 20 in the thickness-wise direction Z. The upper plating layer 711 is belt-shaped and extends in the first direction X and the second direction Y. The upper plating layer 711 is formed over the upper connector 532 and the second protective layer 62 to cover the upper connector 532, the portion of the upper electrode 51 located between the upper connector 532 and the second protective layer 62, and a portion of the second protective layer 62. That is, the upper plating layer 711 includes an overlapping portion 714 that covers a portion of the second protective layer 62. The overlapping portion 714 is an end of the upper plating layer 711 located closer to the resistor body 30 in the first direction X. When the portion of the chip resistor 10 on which the overlapping portion 714 is formed is viewed in the thickness-wise direction Z, the upper electrode 51, the second protective layer 62, and the overlapping portion 714 are stacked in order on the substrate 20.

As shown in FIG. 1, the dimension of the upper plating layer 711 in the second direction Y differs with respect to the first direction X. More specifically, the dimension of the upper plating layer 711 in the second direction Y is shorter at a location closer to the center of the substrate 20 than at a location closer to the end of the substrate 20 in the first direction X. In this regard, it is considered that the upper plating layer 711 has a portion that is shorter than the upper electrode 51 in the second direction Y. However, the length of the upper plating layer 711 in the second direction Y may be constant in the first direction X.

The back plating layer 712 is positioned to face the back surface 22 of the substrate 20 in the thickness-wise direction Z. The back plating layer 712 is belt-shaped and extends in the first direction X and the second direction Y. The back plating layer 712 is formed on the back connector 533 and the back electrode 52 to cover both the back connector 533 and the back electrode 52. That is, the back electrode 52 is covered by the first plating layer 71 together with the back connector 533, which covers a portion of the back electrode 52.

As shown in FIG. 3, the dimension of the back plating layer 712 in the second direction Y differs with respect to the first direction X. More specifically, the dimension of the back plating layer 712 in the second direction Y is shorter at a location closer to the center of the substrate 20 than at a location closer to the end of the substrate 20 in the first direction X. In this regard, it is considered that the back plating layer 712 has a portion that is shorter than the back electrode 52 in the second direction Y. However, the length of the back plating layer 712 in the second direction Y may be constant in the first direction X.

As shown in FIG. 5, the side plating layer 713 is positioned to face the side surface 23 of the substrate 20 in the first direction X. The side plating layer 713 is belt-shaped and extends in the second direction Y and the thickness-wise direction Z. The side plating layer 713 is stacked on the main body 531 of the side electrode 53 to cover at least a portion of the main body 531. In the first embodiment, the side plating layer 713 covers the entirety of the main body 531.

The upper plating layer 711 is joined to the side plating layer 713. The joint of the main body 531 of the side electrode 53 and the upper connector 532 is roundly curved. Accordingly, the joint of the upper plating layer 711 and the side plating layer 713 is roundly curved. Also, the back plating layer 712 is joined to the side plating layer 713. The joint of the main body 531 of the side electrode 53 and the back connector 533 is roundly curved. Accordingly, the joint of the back plating layer 712 and the side plating layer 713 is roundly curved. That is, the first plating layer 71 has a roundly curved portion that covers the first corner 24 and the second corner 26 of the substrate 20 with the side electrode 53.

As shown in FIG. 5, the second plating layer 72 covers the entirety of the first plating layer 71. The second plating layer 72 inhibits tin (Sn) contained in the third plating layer 73 or in solder from entering the first plating layer 71. The second plating layer 72 is formed from, for example, nickel. The thickness of the second plating layer 72, which is referred to as a second plating layer thickness Th7, is less than the thickness of the first plating layer 71, which is referred to as a first plating layer thickness Th6.

The third plating layer 73 covers the entirety of the second plating layer 72. The third plating layer 73 is a portion bonded to the chip resistor 10 with solder. The third plating layer 73 is formed from, for example, tin. The thickness of the third plating layer 73, which is referred to as a third plating layer thickness Th8, is substantially equal to the second plating layer thickness Th7. However, the third plating layer thickness Th8 may be greater or less than the second plating layer thickness Th7.

Each of the second plating layer 72 and the third plating layer 73 includes a roundly curved portion covering the joint of the back plating layer 712 of the first plating layer 71 and the side plating layer 713. Also, each of the second plating layer 72 and the third plating layer 73 includes a roundly curved portion covering the joint of the back plating layer 712 of the first plating layer 71 and the side plating layer 713. In the description hereafter, in the plating layer 70, a portion covering the first corner 24 of the substrate 20 with the side electrode 53 may be referred to as a first curved portion 701, and a portion covering the second corner 26 of the substrate 20 with the side electrode 53 may be referred to as a second curved portion 702. As described above, the first curved portion 701 and the second curved portion 702 are roundly curved.

The plating layer 70 may be formed, for example, through electrolytic plating after the side electrode 53 is formed on the substrate 20. In this case, when forming the first plating layer 71, which has a relatively large thickness, the electrolytic plating may be performed with a higher current density or performed for a longer time than when forming the second plating layer 72 and the third plating layer 73, which have a relatively small thickness.

The chip resistor 10 mounted on the wiring substrate 80 will now be described.

Figure 6:
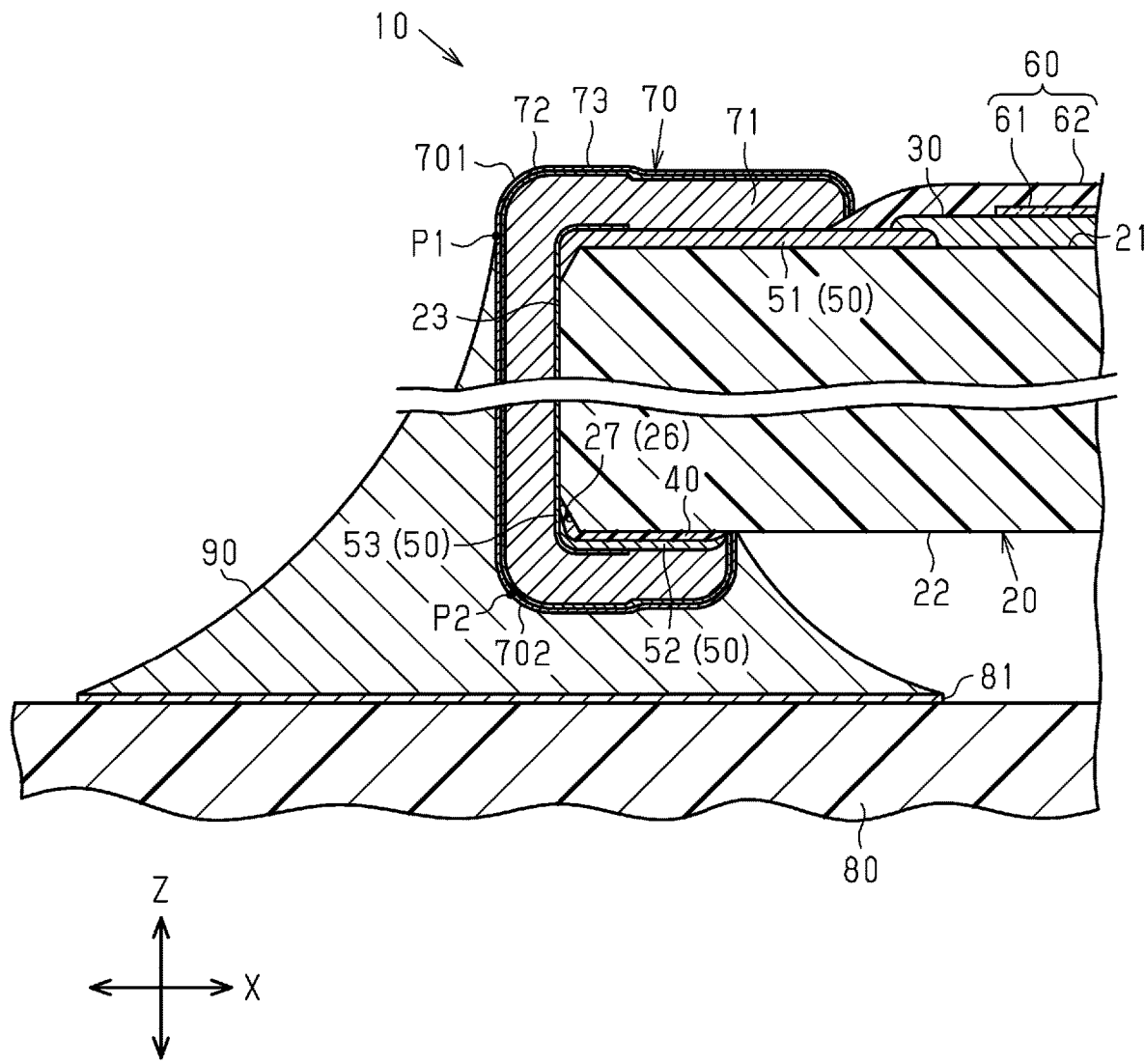
FIG. 6 is a cross-sectional view showing the chip resistor of the first embodiment bonded to a wiring substrate with solder.

As shown in FIG. 6, the plating layer 70 of the chip resistor 10 is bonded to the wiring substrate 80 with solder 90, so that the chip resistor 10 is mounted on the wiring substrate 80. The solder 90 bonds the portions of the plating layer 70 covering the back electrode 52 and the side electrode 53 to a land 81 of the wiring substrate 80. As a result, the two electrodes 50 form a conductive path between the resistor body 30 and the wiring substrate 80. The solder 90 may reach the portion of the plating layer 70 covering the upper electrode 51.

The wiring substrate 80 is formed of, for example, a glass-epoxy resin. In this point, the linear expansion coefficient of the wiring substrate 80 is greater than the linear expansion coefficient of the substrate 20 of the chip resistor 10. The solder 90 is formed from, for example, tin in the same manner as the third plating layer 73.

During use of the chip resistor 10, when the temperature of the environment in which the chip resistor 10 is used (hereafter, may be referred to as "the ambient temperature") changes, the difference in the linear expansion coefficient causes the chip resistor 10 and the wiring substrate 80 to expand or contract in different manners. Therefore, during the use of the chip resistor 10, if the ambient temperature repetitively changes, repetitive stress acts on the solder 90 bonding the chip resistor 10 and the wiring substrate 80. As a result, cracks may be formed in the solder 90. The cracks in the solder 90 include a crack formed in the solder 90 bonding the chip resistor 10 and the wiring substrate 80 and a crack formed in an interface between the solder 90 and the chip resistor 10.

In the first embodiment, the first plating layer thickness Th6 is increased from a normal thickness. For example, the first plating layer thickness Th6 is preferably greater than or equal to 10 μm and is more preferably greater than or equal to 20 μm. In the first embodiment, the first plating layer thickness Th6 is, for example, 30 μm. In the first embodiment, the first plating layer thickness Th6 is greater than the upper electrode thickness Th3. The first plating layer thickness Th6 is greater than the back electrode thickness Th4. The first plating layer thickness Th6 is greater than the side electrode thickness Th5. The first plating layer thickness Th6 is greater than the relief layer thickness Th2. As described above, in the first embodiment, the first plating layer 71 is increased from a normal thickness, thereby reducing the stress acting on the solder 90.

The operation of the first embodiment will now be described.

Specifically, a two-dimensional heat transfer model is created based on the cross-sectional view shown in FIG. 6. The result of thermal stress analysis based on the model will be described. In the thermal stress analysis, von Mises stress generated in the solder 90 is calculated when the ambient temperature of the heat transfer model is increased from 25° C. to 155° C.

Figures 7, 8:
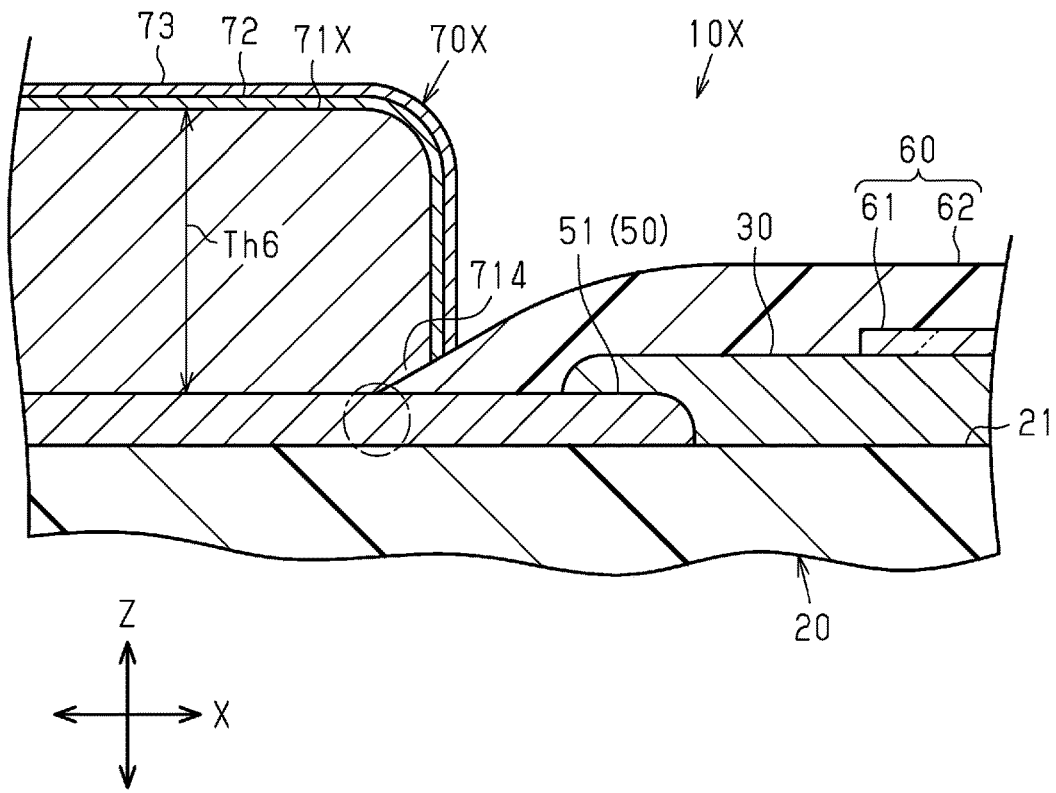
FIG. 7 is a table showing the result of thermal stress analysis of the chip resistor of the first embodiment.
FIG. 8 is a cross-sectional view showing a comparative example of a chip resistor.

FIG. 7 shows von Mises stress at a first measure point P1 and a second measure point P2 in accordance with changes in the first plating layer thickness Th6. As shown in FIG. 6, the first measure point P1 is a location on the portion of the solder 90 that is bonded to the plating layer 70 covering the side electrode 53 and closest to the upper electrode 51. The second measure point P2 is a location on the portion of the solder 90 bonded to the plating layer 70 covering the second corner 26 of the substrate 20. More specifically, each of the first measure point P1 and the second measure point P2 is a point of the solder 90 that contacts the plating layer 70.

The first measure point P1 and the second measure point P2 are portions of the solder 90 that greatly affect a change in the resistance value of the chip resistor 10 when a crack is formed. In addition, the first measure point P1 is a portion of the solder 90 prone to formation of a crack. The second measure point P2 is a portion of the solder 90 prone to concentration of stress. That is, as the stress on the first measure point P1 and the second measure point P2 is decreased, the resistance value of the chip resistor 10 is less likely to be changed by cracks in the solder 90 is limited.

In FIG. 7, in comparative example 1, the first plating layer 71 is not formed. In example 1-1, the first plating layer thickness Th6 is 10 In example 1-2, the first plating layer thickness Th6 is 30 In comparative example 1, example 1-1, and example 1-2, the configuration of the chip resistor 10 is the same except the first plating layer thickness Th6.

As shown in FIG. 7, the comparison of comparative example 1, example 1-1, and example 1-2 shows that when the first plating layer 71 is provided, von Mises stress is decreased at both the first measure point P1 and the second measure point P2. The comparison of example 1-1 and example 1-2 shows that as the first plating layer thickness Th6 increases, von Mises stress is decreased at both the first measure point P1 and the second measure point P2. Although not shown in the drawings, when the ambient temperature of the heat transfer model is decreased from 25° C. to −55° C., von Mises stress also has the tendency to decrease as the first plating layer thickness Th6 is increased.

When the linear expansion coefficient of the substrate 20 of the chip resistor 10 is less than the linear expansion coefficient of the wiring substrate 80 and the ambient temperature is increased, the expansion amount of the chip resistor 10 in the first direction X is less than the expansion amount of the wiring substrate 80 in the first direction X. More precisely, the expansion amount of the chip resistor 10 in the first direction X is less than the expansion amount of the portion of the wiring substrate 80 on which the chip resistor 10 is mounted in the first direction X. Therefore, stress corresponding to the difference in the expansion amount between the chip resistor 10 and the wiring substrate 80 may act on the solder 90 bonding the chip resistor 10 and the wiring substrate 80.

In this regard, in the first embodiment, the plating layer 70 includes the first plating layer 71 having a thickness of 10 μm or greater and formed of copper. In other words, the plating layer 70 includes the first plating layer 71 that is greater in the linear expansion coefficient than the substrate 20 of the chip resistor 10 and has a thickness increased from a normal thickness. When heat is generated from the chip resistor 10, the first plating layer 71 expands. As a result, the difference in the expansion amount between the chip resistor 10 and the wiring substrate 80 is likely to be decreased. Thus, when the ambient temperature changes, less stress acts on the solder 90.

However, if the first plating layer thickness Th6 is greater than 60 μm, while formation of cracks in the solder 90 is limited, the following problems may occur.

FIG. 8 shows a chip resistor 10X that includes a plating layer 70X including a first plating layer 71X having a first plating layer thickness Th6 of 60 μm or greater. When the first plating layer thickness Th6 is greater than 60 μm, cracks may be formed in the upper electrode 51 before cracks are formed in the solder 90. More specifically, in the upper electrode 51, cracks may be formed in the vicinity of the interface between the portion covered by the first protective layer 61 and the portion covered by the first plating layer 71X. That is, cracks may be formed in a portion surrounded by single-dashed lines shown in FIG. 8. Therefore, the first plating layer thickness Th6 is preferably less than or equal to 60 μm and more preferably less than or equal to 40 μm.

The advantages of the first embodiment will now be described.

(1) The chip resistor 10 includes the first plating layer 71 having a thickness of 10 μm or greater. Thus, as compared to a comparative example of the chip resistor 10 that does not include the first plating layer 71, less stress is generated in the solder 90 when the ambient temperature changes. Accordingly, the chip resistor 10 limits formation of cracks in the solder 90 that bonds the chip resistor 10 and the wiring substrate 80.

(2) The first plating layer thickness Th6 is less than or equal to 60 μm. Thus, the chip resistor 10 limits formation of cracks in the vicinity of the interface between the portion of the upper electrode 51 covered by the first protective layer 61 and the portion of the upper electrode 51 covered by the first plating layer 71.

(3) The first plating layer 71 is formed from copper that is greater in the linear expansion coefficient than the glass-epoxy resin forming the wiring substrate 80. Thus, the chip resistor 10 further reduces the stress generated in the solder 90 when the ambient temperature changes.

(4) In the plating layer 70, the first curved portion 701, which covers the first corner 24 of the substrate 20, and the second curved portion 702, which covers the second corner 26 of the substrate 20, are roundly curved. When the solder 90 is formed to cover the first curved portion 701, the chip resistor 10 limits concentration of stress on the portion of the solder 90 covering the first curved portion 701. Also, when the solder 90 is formed to cover the second curved portion 702, the chip resistor 10 limits concentration of stress on the portion of the solder 90 covering the second curved portion 702.

(5) The chip resistor 10 includes the relief layer 40. Thus, the chip resistor 10 further reduces the stress generated in the solder when the ambient temperature changes.

Second Embodiment

A second embodiment of a chip resistor 10A will now be described with reference to FIGS. 9 to 11. In the second embodiment, same reference characters are given to those components that are the same as the corresponding components of the first embodiment. Such components will not be described in detail. The chip resistor 10A of the second embodiment differs from the chip resistor 10 of the first embodiment mainly in that the chip resistor 10A does not include the relief layers 40.

Figure 9:
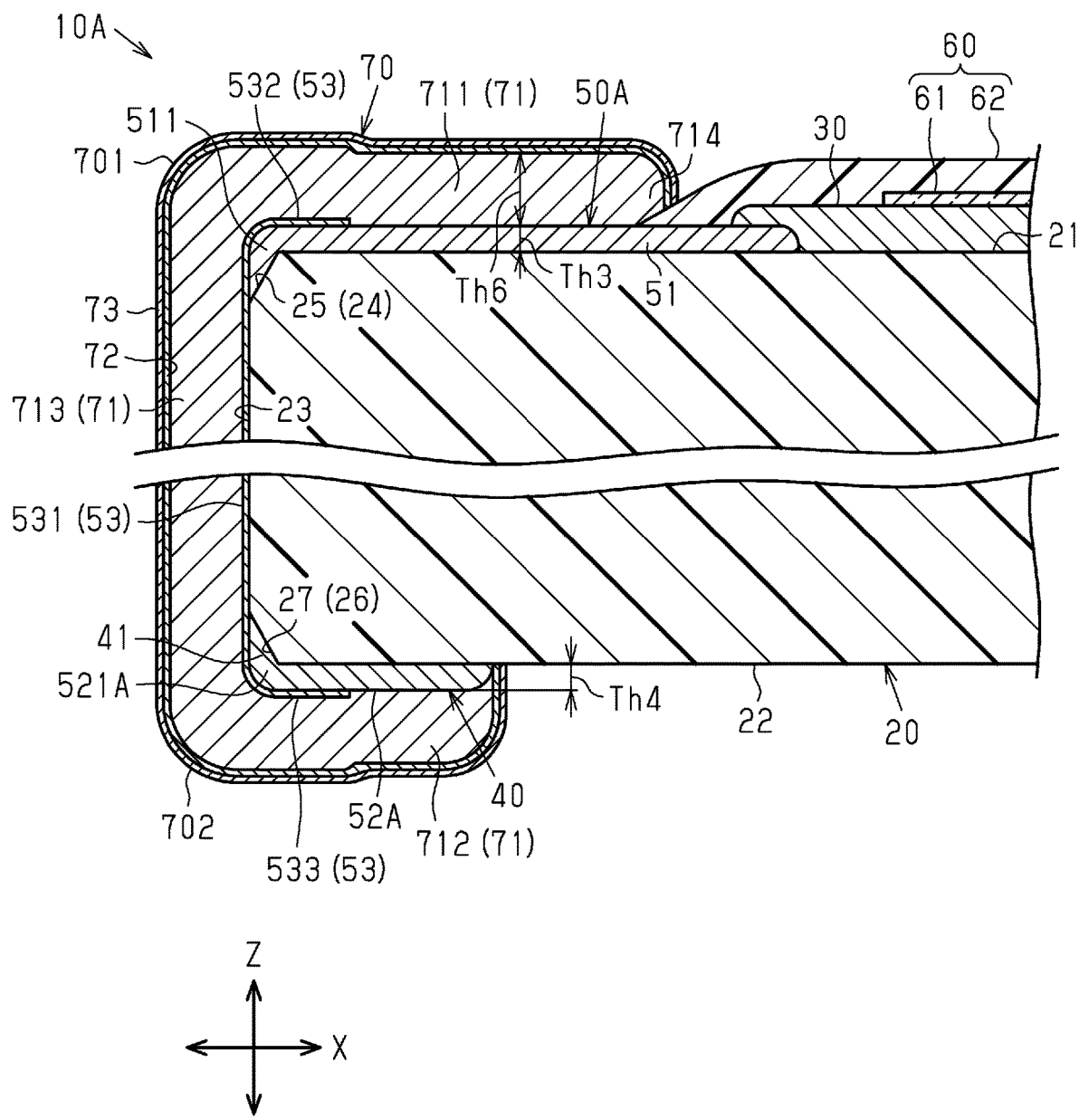
FIG. 9 is a cross-sectional view showing a second embodiment of a chip resistor.

As shown in FIG. 9, the chip resistor 10A includes a substrate 20, a resistor body 30, an electrode 50A, a protective layer 60, and a plating layer 70. The electrode 50A includes an upper electrode 51, a back electrode 52A, and a side electrode 53.

The back electrode 52A is belt-shaped and is elongated more in the second direction Y than in the first direction X. The back electrode 52A is directly formed on the back surface 22 of the substrate 20 without the relief layers 40. The back electrode 52A is formed closer to the end of the substrate 20 in the first direction X. The back electrode 52A is also formed on the second inclined surface 27 of the substrate 20. Since the second inclined surface 27 is inclined, the portion of the back electrode 52A formed on the first inclined surface 25 is roundly curved, defining a back electrode end 521A. The back electrode thickness Th4 is substantially equal to the upper electrode thickness Th3. For example, when the upper electrode thickness Th3 is 14 μm, the back electrode thickness Th4 is 14 μm.

The operation of the second embodiment will now be described.

Specifically, a two-dimensional heat transfer model is created based on the cross-sectional view shown in FIG. 9.

The result of thermal stress analysis based on the model will be described. In the thermal stress analysis, von Mises stress generated in the solder 90 is calculated when the ambient temperature of the heat transfer model is increased from 25° C. to 155° C.

Figures 10, 11:
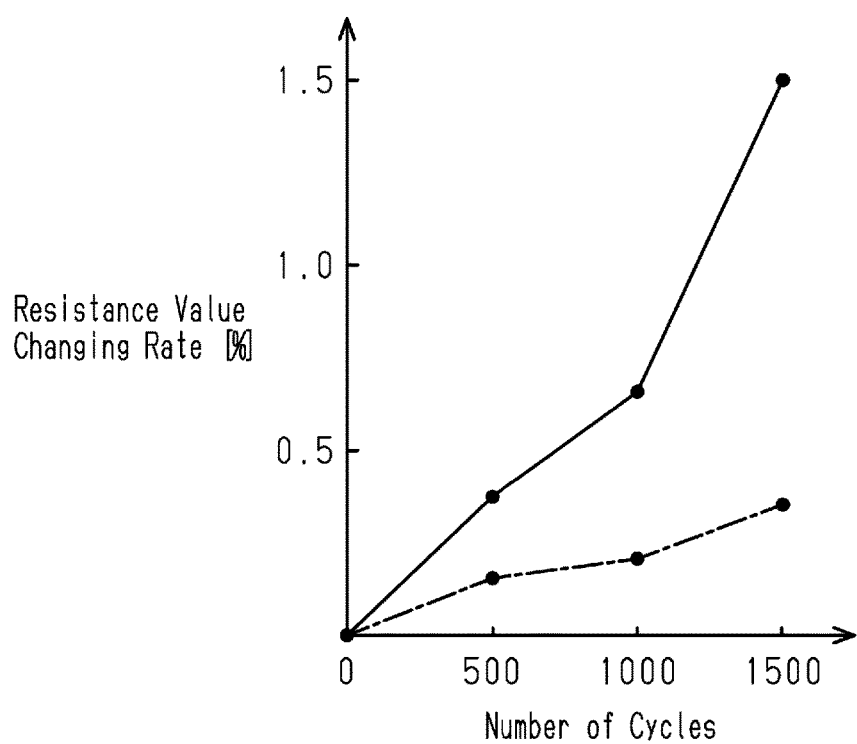
FIG. 10 is a table showing the result of thermal stress analysis of the chip resistor of the second embodiment.
FIG. 11 is a graph showing the result of a temperature cycle test of the chip resistor of the second embodiment.

FIG. 10 shows von Mises stress at a first measure point P1 and a second measure point P2 in accordance with changes in the first plating layer thickness Th6. The first measure point P1 and the second measure point P2 are points of the solder 90 that contact the plating layer 70 as shown in FIG. 6. In comparative example 2, the first plating layer 71 is not formed. In example 2-1, the first plating layer thickness Th6 is 10 µm. In example 2-2, the first plating layer thickness Th6 is 30 µm. In comparative example 2, example 2-1, and example 2-2, the configuration of the chip resistor 10A is the same except the first plating layer thickness Th6.

As shown in FIG. 10, comparison of comparative example 2, example 2-1, and example 2-2 shows that when the first plating layer 71 is formed, von Mises stress is decreased at both the first measure point P1 and the second measure point P2. The comparison of example 2-1 and example 2-2 shows that as the first plating layer thickness Th6 increases, von Mises stress is decreased at both the first measure point P1 and the second measure point P2. Further, the comparison with the analysis result of the first embodiment shows that the tendency of von Mises stress to decrease at the first measure point P1 and the second measure point P2 as the first plating layer thickness Th6 increases is irrelevant to whether the relief layers 40 are present or not.

The result of the temperature cycle test of the chip resistor 10A will now be described.

The temperature cycle test measures a resistance value changing rate when the ambient temperature is cyclically changed to a high temperature and a low temperature. More specifically, the temperature cycle test measures the resistance value changing rate when the temperature cycle is repeated so that the ambient temperature is decreased from 155° C. to −55° C. and then increased from −55° C. to 155° C.

To obtain the resistance value changing rate, the resistance value at a time of starting a test is subtracted from the resistance value after a predetermined number of repetitions of the temperature cycle, and then the subtraction value is divided by the resistance value at the time of starting the test. When the resistance value changing rate has a positive value, it indicates that the resistance value has increased. When the resistance value changing rate has a negative value, it indicates that the resistance value has decreased. The resistance value is measured using the conductive path including the chip resistor 10A, the wiring substrate 80, and the solder 90. Therefore, when cracks are formed in the solder 90, the resistance value changing rate will change.

FIG. 11 is a graph showing changes in the resistance changing rate with the number of repetitions of the temperature cycle in comparative example 2 and example 2-2.

In FIG. 11, comparative example 2 is indicated by the solid line, which shows that the resistance value changing rate exceeds 1% when the temperature cycle exceeds 1500 times. In FIG. 11, example 2-2 is indicated by the single-dashed line, which shows that the resistance value changing rate is less than 0.5% even when the temperature cycle exceeds 1500 times. The comparison of the slope of the resistance value changing rate between comparative example 2 and example 2-2 shows that example 2-2 has a milder slope. When the first plating layer 71 is formed, the temperature cycle property is better than when the first plating layer 71 is not formed. In other words, changes in the performance of the chip resistor 10A during continuous use are smaller.

The advantages of the second embodiment will now be described. The second embodiment has the advantages (1) to (4) of the first embodiment.

Third Embodiment

A third embodiment of a chip resistor 10B will now be described with reference to FIGS. 12 and 13. In the third embodiment, same reference characters are given to those components that are the same as the corresponding components of the first embodiment. Such components will not be described in detail. The chip resistor 10B of the third embodiment differs from the chip resistor 10 of the first embodiment in the substrate thickness Th1.

Figures 12, 13:
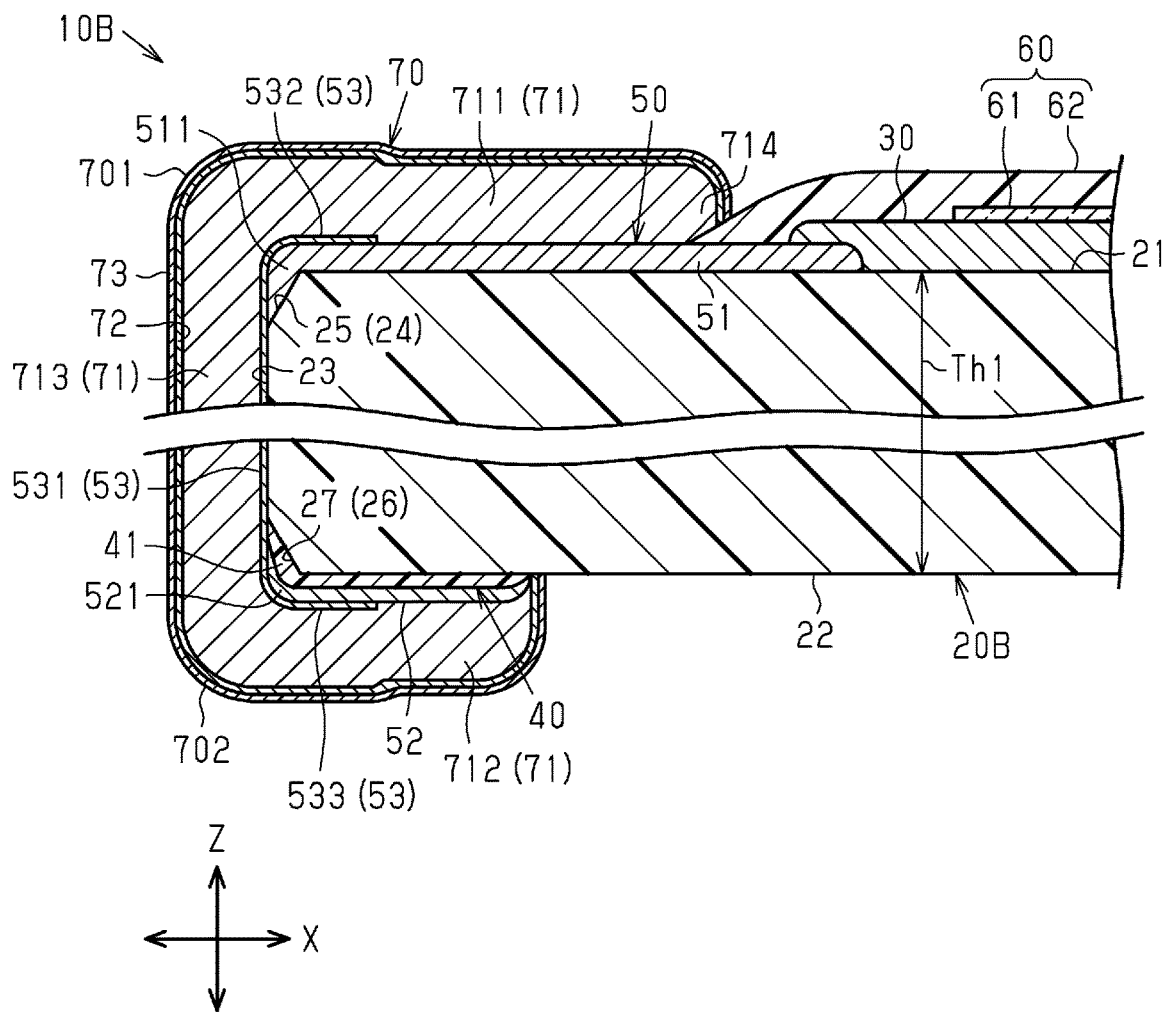
FIG. 12 is a cross-sectional view showing a third embodiment of a chip resistor.
FIG. 13 is a table showing the result of thermal stress analysis of the chip resistor of the third embodiment.

As shown in FIG. 12, the chip resistor 10B includes a substrate 20B, a resistor body 30, a relief layer 40, an electrode 50, a protective layer 60, and a plating layer 70.

In an example, the dimension of the substrate 20B in the first direction X is 3.2 mm, the dimension of the substrate 20B in the second direction Y is 1.6 mm. Preferably, the substrate thickness Th1 is greater than or equal to 0.28 mm and less than 0.47 mm. In the third embodiment, the substrate thickness Th1 is 0.28 mm. Thus, the substrate thickness Th1 of the third embodiment is less than the substrate thickness Th1 of the first embodiment. The substrate 20B of the third embodiment has the same configuration as the substrate 20 of the first embodiment except substrate thickness Th1.

The operation of the third embodiment will now be described.

Specifically, a two-dimensional heat transfer model is created based on the cross-sectional view shown in FIG. 12. The result of thermal stress analysis based on the model will be described. In the thermal stress analysis, von Mises stress generated in the solder 90 is calculated when the ambient temperature of the heat transfer model is increased from 25° C. to 155° C.

FIG. 13 shows von Mises stress at the first measure point P1 and the second measure point P2 in accordance with changes in the thickness of the substrate 20B. The first measure point P1 and the second measure point P2 are points of the solder 90 that contact the plating layer 70 as shown in FIG. 6. As shown in FIG. 13, in comparative example 3, the substrate thickness Th1 is 0.47 mm, that is, same as example 1-2 in the first embodiment. In example 3, the substrate thickness Th1 is 0.28 mm. Comparative example 3 and example 3 have the same configuration of the chip resistor 10B except for the substrate thickness Th1.

As shown in FIG. 13, the comparison of comparative example 3 and example 3 shows that the decrease in the substrate thickness Th1 decreases von Mises stress at both the first measure point P1 and the second measure point P2. Although not shown in the drawings, this tendency is also obtained when the relief layers 40 are not formed and when the first plating layer 71 is not formed.

As described above, when the chip resistor 10B generates heat, the expansion amount of the wiring substrate 80 in the first direction X is greater than the expansion amount of the chip resistor 10B in the first direction X. That is, the chip resistor 10B is stretched in the first direction X by the wiring substrate 80 expanding in the first direction X. Since the substrate thickness Th1 is small, the chip resistor 10B is easily stretched in the first direction X by the wiring substrate 80 expanding in the first direction X. In other words, the small substrate thickness Th1 allows for easy bending of the chip resistor 10B. As a result, the difference in the expansion amount in the first direction X between the chip resistor 10B and the wiring substrate 80 is likely to be decreased. Thus, when the ambient temperature changes, less stress acts on the solder 90.

The advantages of the third embodiment will now be described. The third embodiment has the following advantage in addition to the advantages (1) to (5) of the first embodiment.

(6) The chip resistor 10B includes the substrate 20B having the substrate thickness Th1 of 0.28 mm. As compared to the chip resistor 10 of the first embodiment, which includes the substrate 20 having the substrate thickness Th1 of 0.47 mm, the substrate 20 of the chip resistor 10B readily deforms following the wiring substrate 80 when the ambient temperature changes. Thus, the chip resistor 10B reduces stress acting on the solder 90 when the ambient temperature changes.

Fourth Embodiment

A fourth embodiment of a chip resistor 10C will now be described with reference to FIG. 14. In the fourth embodiment, same reference characters are given to those components that are the same as the corresponding components of the second embodiment. Such components will not be described in detail. The chip resistor 10C of the fourth embodiment differs from the chip resistor 10 of the first embodiment in the configuration of the back surface 22 of the substrate 20.

Figure 14:
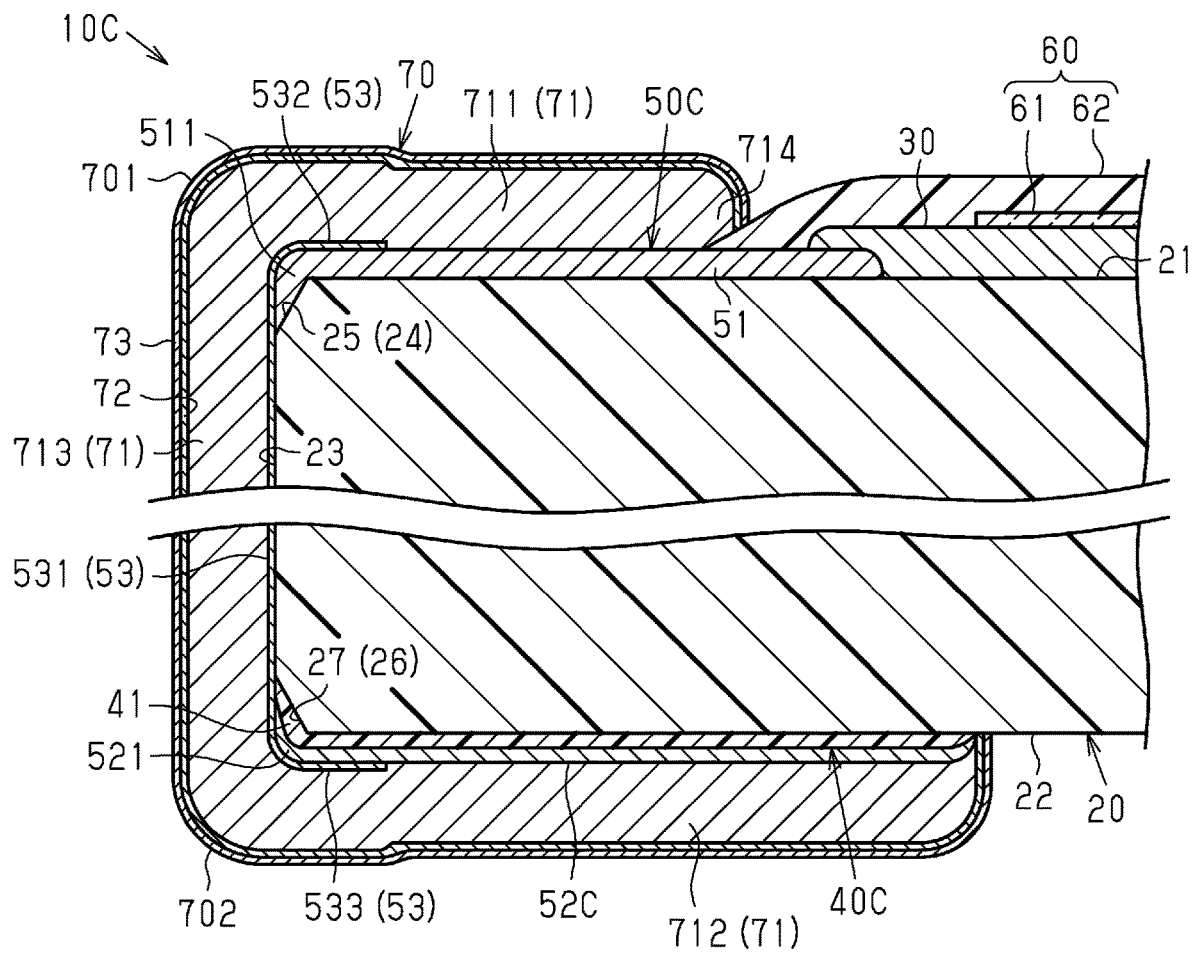
FIG. 14 is a cross-sectional view showing a fourth embodiment of a chip resistor.

As shown in FIG. 14, the chip resistor 10C includes a substrate 20, a resistor body 30, a relief layer 40C, an electrode 50C, a protective layer 60, and a plating layer 70.

The relief layer 40C is directly formed on the back surface 22 of the substrate 20 and is in contact with the back surface 22 of the substrate 20. The relief layer 40C is greater in dimension in the first direction X than the upper electrode 51.

The electrode 50C includes an upper electrode 51, a back electrode 52C, and a side electrode 53. The back electrode 52C is belt-shaped and is elongated more in the second direction Y than in the first direction X. The back electrode 52C is greater in dimension in the first direction X than the upper electrode 51. The back electrode 52C is formed on the back surface 22 of the substrate 20 with the relief layer 40C disposed therebetween.

The operation and advantages of the fourth embodiment will now be described. The fourth embodiment has operation and advantages equivalent to the first embodiment. In the fourth embodiment, the upper electrode 51 and the back electrode 52 may be equal in dimension in the first direction X.

Fifth Embodiment

A fifth embodiment of a chip resistor 10D will now be described with reference to FIG. 15. In the fifth embodiment, same reference characters are given to those components that are the same as the corresponding components of the first embodiment. Such components will not be described in detail. The chip resistor 10D of the fifth embodiment differs from the chip resistor 10 of the first embodiment in the structure of a plating layer 70.

Figure 15:
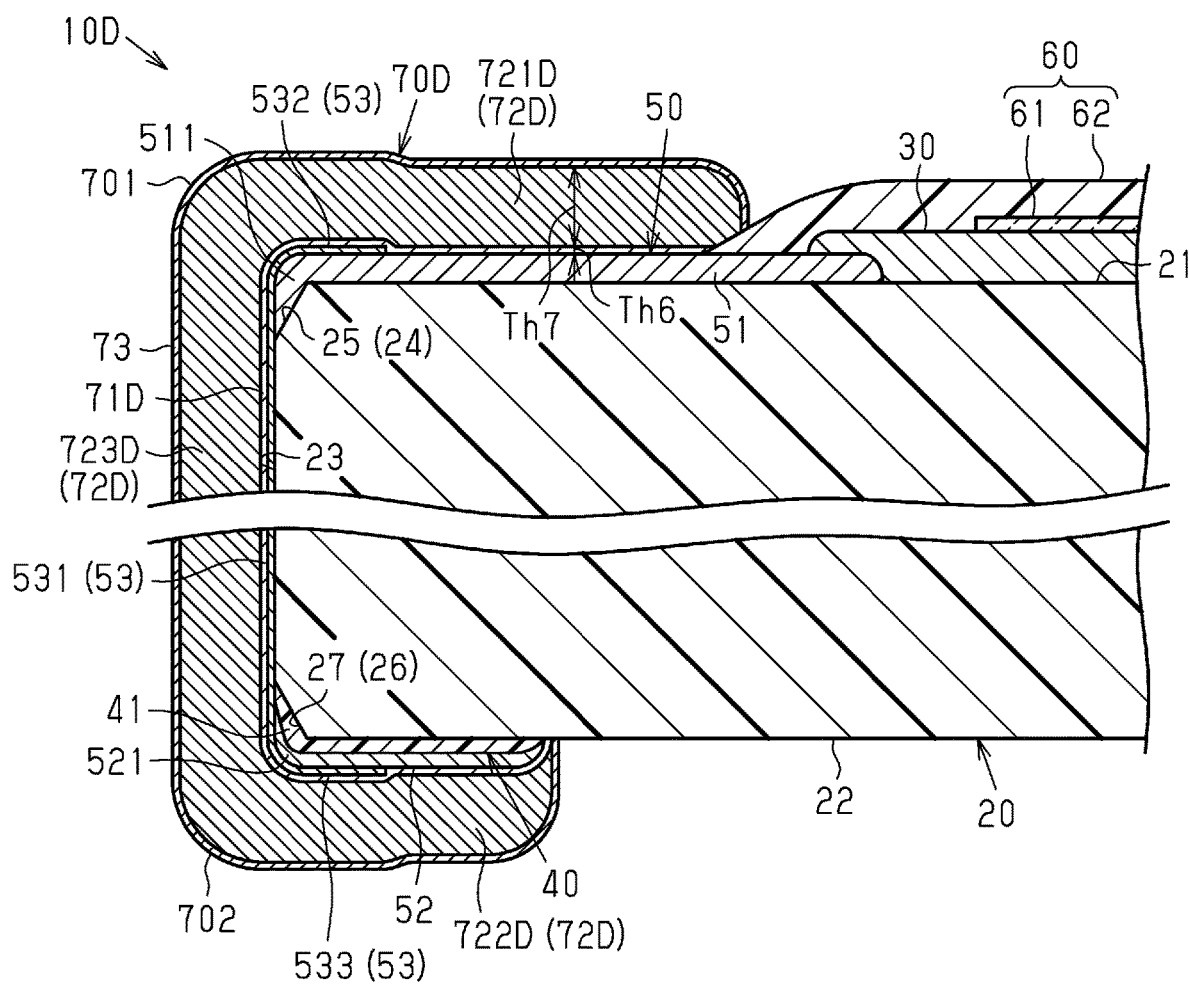
FIG. 15 is a cross-sectional view showing a fifth embodiment of a chip resistor.

As shown in FIG. 15, the chip resistor 10D includes a substrate 20, a resistor body 30, a relief layer 40, an electrode 50, a protective layer 60, and a plating layer 70D.

The plating layer 70D includes a first plating layer 71D, a second plating layer 72D, which is an example of "metal plating layer", and a third plating layer 73.

The first plating layer 71D is formed from, for example, copper. The first plating layer 71D is formed over the upper electrode 51, the back electrode 52, and the side electrode 53. The first plating layer 71D covers at least a portion of the upper electrode 51, at least a portion of the back electrode 52, and at least a portion of the side electrode 53. More specifically, the first plating layer 71D covers a large portion of the upper electrode 51, the entirety of the back electrode 52, and the entirety of the side electrode 53.

The second plating layer 72D is formed from, for example, nickel. The second plating layer 72D covers the first plating layer 71D. The second plating layer 72D includes an upper plating layer 721D covering at least a portion of the upper electrode 51, a back plating layer 722D covering at least a portion of the back electrode 52, and a side plating layer 723D covering at least a portion of the side electrode 53.

The upper plating layer 721D is positioned to face the upper surface 21 of the substrate 20 in the thickness-wise direction Z. The upper plating layer 721D covers the upper connector 532 of the side electrode 53 and the portion of the upper electrode 51 that is not covered by the upper connector 532 and the protective layer 60 together with the first plating layer 71D. The upper plating layer 721D also covers an end of the second protective layer 62 in the first direction X. The back plating layer 722D is positioned to face the back surface 22 of the substrate 20 in the thickness-wise direction Z. The back plating layer 722D covers the back connector 533 of the side electrode 53 and the portion of the back electrode 52 that is not covered by the back connector 533 together with the first plating layer 71D. The side plating layer 723D is positioned to face the side surface 23 of the substrate 20 in the first direction X. The side plating layer 723D covers the main body 531 of the side electrode 53 together with the first plating layer 71D.

In the fifth embodiment, the second plating layer thickness Th7 is greater than the first plating layer thickness Th6. More specifically, the second plating layer thickness Th7 is preferably 10 to 60 μm and more preferably 20 to 40 μm. In the fifth embodiment, the second plating layer thickness Th7 is, for example, 30 μm.

The operation and advantages of the fifth embodiment will now be described. In the fifth embodiment, the chip resistor 10D includes the second plating layer 72D formed from nickel, which is similar in linear expansion coefficient to copper, and having a large thickness. Thus, the fifth embodiment has operation and advantages similar to the first embodiment.

Sixth Embodiment

A sixth embodiment of a chip resistor 10E will now be described with reference to FIG. 16. In the sixth embodiment, same reference characters are given to those components that are the same as the corresponding components of the first embodiment. Such components will not be described in detail. The chip resistor 10E of the sixth embodiment differs from the chip resistor 10 of the first embodiment in the structure of a plating layer 70.

Figure 16:
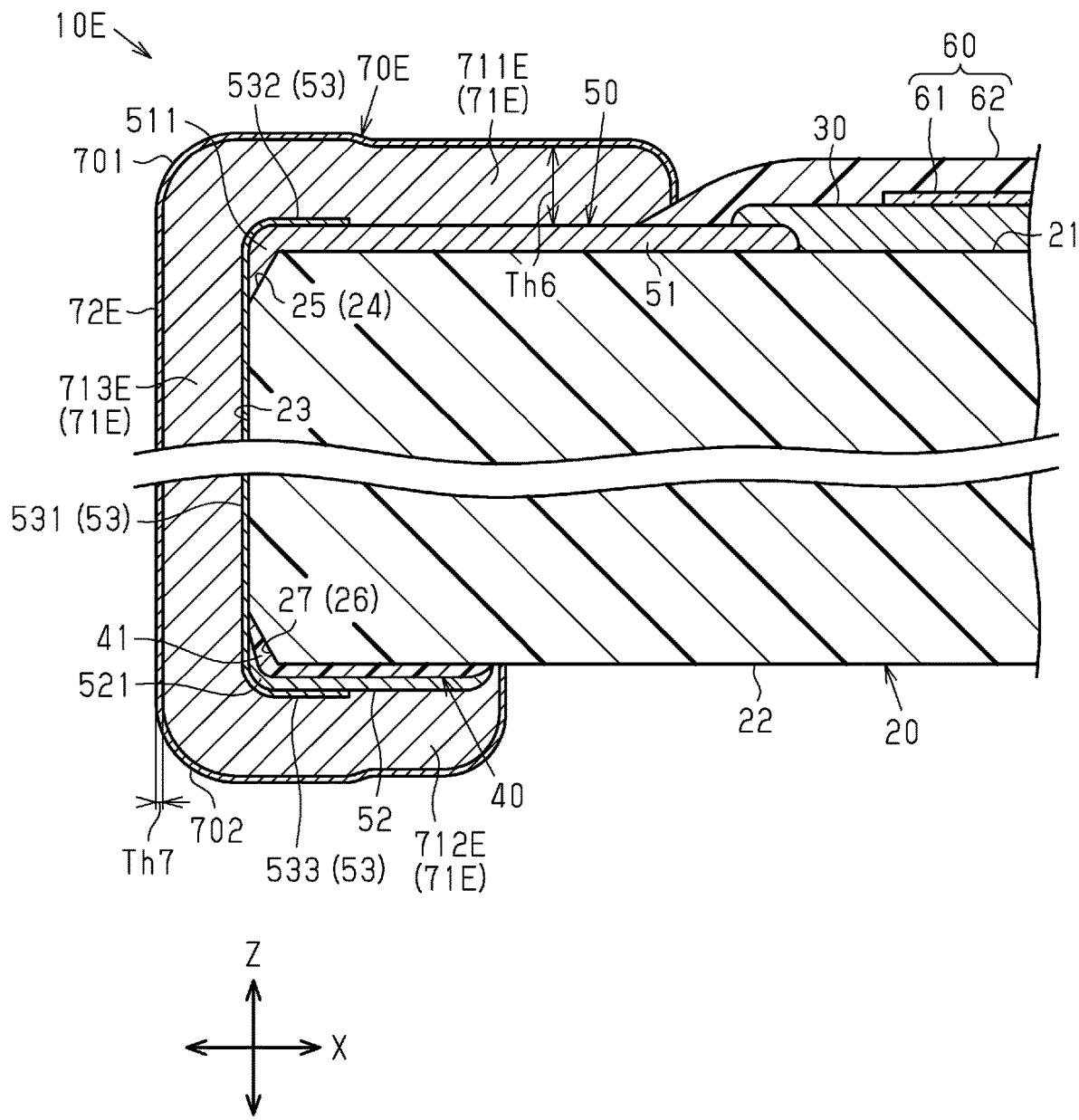
FIG. 16 is a cross-sectional view showing a sixth embodiment of a chip resistor.

As shown in FIG. 16, the chip resistor 10E includes a substrate 20, a resistor body 30, a relief layer 40, an electrode 50, a protective layer 60, and a plating layer 70E.

The plating layer 70E includes a first plating layer 71E, which is an example of a "metal plating layer", and a second plating layer 72E.

The first plating layer 71E is formed from, for example, nickel. The first plating layer 71E is formed over the upper electrode 51, the back electrode 52, and the side electrode 53. The first plating layer 71E includes an upper plating layer 711E covering at least a portion of the upper electrode 51, a back plating layer 712E covering at least a portion of the back electrode 52, and a side plating layer 713E covering at least a portion of the side electrode 53.

The upper plating layer 711E is positioned to face the upper surface of the substrate 20 in the thickness-wise direction Z. The upper plating layer 711E covers the upper connector 532 of the side electrode 53, the portion of the upper electrode 51 that is not covered by the upper connector 532 and the protective layer 60, and an end of the second protective layer 62 in the first direction X. The back plating layer 712E is positioned to face the back surface 22 of the substrate 20 in the thickness-wise direction Z. The back plating layer 712E covers the back connector 533 of the side electrode 53 and the portion of the back electrode 52 that is not covered by the back connector 533. The side plating layer 713E is positioned to face the side surface 23 of the substrate 20 in the first direction X. The side plating layer 713E covers the main body 531 of the side electrode 53.

The first plating layer thickness Th6 is preferably 10 to 60 μm and more preferably 20 to 40 μm. In the sixth embodiment, the first plating layer thickness Th6 is, for example, 30 μm.

The second plating layer 72E is formed from, for example, tin. The second plating layer 72E covers the first plating layer 71E. The second plating layer 72E is a portion bonded to the chip resistor 10E with the solder 90. The second plating layer thickness Th7 is less than the first plating layer thickness Th6. That is, the second plating layer 72E has a structure corresponding to the third plating layer 73 of the first embodiment.

The operation and advantages of the sixth embodiment will now be described. In the sixth embodiment, the chip resistor 10E includes the first plating layer 71E formed from nickel, which is similar in linear expansion coefficient to copper, and having a large thickness. Thus, the sixth embodiment has operation and advantages similar to the first embodiment.

The embodiments described above may be modified as follows. The embodiments and the following modified examples may be combined as long as the combined modified examples remain technically consistent with each other.

The plating layers 70, 70D, and 70E do not necessarily have to include the upper plating layers 711, 711E, and 721D. In other words, the plating layers 70, 70D, and 70E may include only the back plating layers 712, 712E, and 722D and the side plating layer 713, 713E, and 723D.

The upper plating layers 711, 711E, and 721D may cover the entirety of the upper electrode 51. In this case, it is preferred that the upper electrode 51 covers an end of the resistor body 30 in the first direction X.

The back plating layers 712, 712E, and 722D may cover at least a portion of the back electrodes 52, 52A, and 52C.

The side plating layers 713, 713E, and 723D may cover at least a portion of the side electrode 53.

In the substrates 20 and 20B, the first corner 24 does not have to include the first inclined surface 25, and the second corner 26 does not have to include the second inclined surface 27. In other words, the first corner 24 and the second corner 26 may have a right angle.

Each of the upper electrode thickness Th3, the back electrode thickness Th4, and the side electrode thickness Th5 may be greater than or equal to the first plating layer thickness Th6 of the first plating layers 71 and 71E, each of which is an example of "metal plating layer". Also, each of the upper electrode thickness Th3, the back electrode thickness Th4, and the side electrode thickness Th5 may be greater than or equal to the second plating layer thickness Th7 of the second plating layer 72D, which is an example of a "metal plating layer".

Technical concepts obtained from the above embodiments and the modified examples will now be described.

A chip resistor includes a substrate, a resistor body, an upper electrode, a back electrode, and a side electrode. The substrate includes an upper surface and a back surface intersecting a thickness-wise direction and a side surface joining the upper surface and the back surface. The upper electrode and the resistor body are formed on the upper surface. The back electrode is formed on the back surface. The side electrode is formed on the side surface. The substrate has a thickness that is greater than or equal to 0.28 mm and less than or equal to 0.47 mm.

REFERENCE SIGNS LIST 10, 10A to 10E) chip resistor; 10X) chip resistor of comparative example; 20, 20B) substrate; 21) upper surface; 22) back surface; 23) side surface; 24) first corner; 25) first inclined surface; 26) second corner (example of corner); 27) second inclined surface (example of inclined surface); 30) resistor body; 31) trimming groove; 40, 40C) relief layer; 41) relief layer end; 50, 50A, 50C) electrode; 51) upper electrode; 511) upper electrode end; 52, 52A, 52C) back electrode; 521, 521A) back electrode end; 53) side electrode; 531) main body; 532) upper connector; 533) back connector; 60) protective layer; 61) first protective layer; 62) second protective layer; 70, 70D, 70E) plating layer; 701) first curved portion; 702) second curved portion; 70X) plating layer of comparative example; 71) first plating layer (example of metal plating layer); 71D) first plating layer; 71E) first plating layer (example of metal plating layer); 711, 711E) upper plating layer; 712, 712E) back plating layer; 713, 713E) side plating layer; 714) overlapping portion; 71X) first plating layer of comparative example; 72) second plating layer; 72D) second plating layer (example of metal plating layer); 72E) second plating layer; 721D) upper plating layer; 722D) back plating layer; 723D) side plating layer; 73) third plating layer; 80) wiring substrate; 81) land; P1) first measure point; P2) second measure point; Th1) substrate thickness; Th2) relief layer thickness; Th3) upper electrode thickness; Th4) back electrode thickness; Th5) side electrode thickness; Th6) first plating layer thickness; Th7) second plating layer thickness; Th8) third plating layer thickness; X) first direction; Y) second direction; Z) thickness-wise direction

The invention claimed is:

1. A chip resistor, comprising:
a substrate including an upper surface, a back surface, and a side surface, the upper surface and the back surface intersecting a thickness-wise direction, and the side surface joining the upper surface and the back surface;
an upper electrode and a resistor body formed on the upper surface;
a back electrode formed on the back surface;
a side electrode formed on the side surface; and
a metal plating layer including a back plating layer covering at least a portion of the back electrode and a side plating layer covering at least a portion of the side electrode, wherein the metal plating layer has a thickness that is greater than or equal to 10 μm and less than or equal to 60 μm, wherein
- the substrate includes a corner joining the back surface and the side surface,
- the corner includes an inclined surface intersecting the back surface and the side surface, and
- the metal plating layer includes a portion that covers the corner and is roundly curved.

2. The chip resistor according to claim 1, wherein the thickness of the metal plating layer is greater than or equal to 20 μm and less than or equal to 40 μm.

3. The chip resistor according to claim 1, wherein the metal plating layer is greater in thickness than the back electrode.

4. The chip resistor according to claim 1, wherein the metal plating layer is greater in thickness than the side electrode.

5. The chip resistor according to claim 1, wherein the metal plating layer is greater in thickness than the upper electrode.

6. The chip resistor according to claim 1, wherein the upper electrode is greater in thickness than the back electrode.

7. The chip resistor according to claim 1, wherein the substrate has a thickness that is greater than or equal to 0.28 mm and less than or equal to 0.47 mm.

8. The chip resistor according to claim 1, wherein the metal plating layer includes copper.

9. The chip resistor according to claim 1, further comprising a second plating layer wherein the metal plating layer includes a first plating layer, wherein
- the second plating layer covers the first plating layer, and
- the second plating layer includes nickel.

10. The chip resistor according to claim 1, further comprising a first plating layer covering at least a portion of the side electrode and at least a portion of the back electrode, wherein
- the metal plating layer includes a second plating layer covering the first plating layer, and
- the second plating layer includes nickel.

11. The chip resistor according to claim 9, further comprising a third plating layer covering the second plating layer, wherein the third plating layer includes tin.

12. The chip resistor according to claim 1, wherein the side electrode is formed from an alloy including nickel and chromium.

13. The chip resistor according to claim 1, wherein the back electrode is formed from a synthetic resin including a metal particle.

14. The chip resistor according to claim 1, wherein the substrate is formed from a ceramic including alumina.

15. The chip resistor according to claim 1, further comprising a relief layer formed between the back surface of the substrate and the back electrode and formed from an insulative resin.

16. The chip resistor according to claim 1, wherein the metal plating layer includes an upper plating layer covering at least a portion of a surface of the upper electrode.

17. The chip resistor according to claim 16, further comprising a protective layer covering the resistor body and a portion of the upper electrode, wherein
- the upper plating layer includes an overlapping portion, and
- the overlapping portion covers at least partially a portion of the protective layer that covers the upper electrode.

* * * * *